US012745363B2

(12) United States Patent
Gundogan et al.

(10) Patent No.: US 12,745,363 B2
(45) Date of Patent: Sep. 22, 2026

(54) ONE PIECE INFORMATION HANDLING SYSTEM BEZEL AND LATCH

(71) Applicant: Dell Products L.P., Round Rock, TX (US)

(72) Inventors: Ilhan C. Gundogan, Lexington, MA (US); Jacky Jianguo Pang, Shanghai (CN); John C. Donachy, Austin, TX (US)

(73) Assignee: Dell Products L.P., Round Rock, TX (US)

(*) Notice: Subject to any disclaimer, the term of this patent is extended or adjusted under 35 U.S.C. 154(b) by 724 days.

(21) Appl. No.: 18/316,315

(22) Filed: May 12, 2023

(65) Prior Publication Data

US 2024/0381560 A1 Nov. 14, 2024

(51) Int. Cl.
*H05K 7/14* (2006.01)

(52) U.S. Cl.
CPC ......... *H05K 7/1489* (2013.01); *H05K 7/1402* (2013.01); *H05K 7/1488* (2013.01)

(58) Field of Classification Search
CPC .. H05K 7/1489; H05K 7/1402; H05K 7/1488; H05K 7/1495; H05K 7/1401; H05K 7/1409; H05K 7/1405; H05K 5/0221; H05K 5/023; H05K 5/0204; H05K 9/0081; H05K 5/0213; H05K 5/0247; E05C 9/026; E05C 9/10
See application file for complete search history.

(56) References Cited

U.S. PATENT DOCUMENTS

| | | | | |
|---|---|---|---|---|
| 6,018,456 | A * | 1/2000 | Young | G06F 1/181 361/679.4 |
| 6,259,605 | B1 * | 7/2001 | Schmitt | G06F 1/183 361/725 |
| 6,775,093 | B1 * | 8/2004 | Smith | G11B 15/6825 |
| D664,959 | S * | 8/2012 | Terwilliger | D14/444 |
| 9,078,349 | B1 * | 7/2015 | Lewis | H05K 5/0204 |
| 9,420,718 | B2 * | 8/2016 | Du | H05K 3/325 |
| 9,668,371 | B1 * | 5/2017 | Strmiska | H05K 7/1489 |
| 10,251,299 | B1 * | 4/2019 | Wang | E05C 9/026 |
| 10,324,503 | B1 * | 6/2019 | O'Donnell | H05K 9/0062 |
| 11,412,633 | B2 * | 8/2022 | Zhong | G06F 1/181 |
| 11,613,908 | B2 * | 3/2023 | Tower | H05K 5/0221 292/66 |
| 11,665,840 | B1 * | 5/2023 | O'Donnell | H05K 7/1409 361/801 |

(Continued)

*Primary Examiner* — Devin K Barnett

(74) *Attorney, Agent, or Firm* — ZAGORIN CAVE LLP; Robert W. Holland

(57) ABSTRACT

An information handling system rack has plural rack slots that accept server information handling systems and secure bezels that couple to the rack to cover the server information handling systems and lock in place. Nonsecure bezels couple to rack slot openings to block airflow through the rack when an information handling system is not present. The nonsecure bezel has latch members that match the secure bezel and that interact with a similar release button through a contiguous piece of material, such as an injection molded piece that defines the release button connected to the latch members and a spring member that defines a pivot location where the latch members are closer to the release button than the pivot location so that a press of the release member retracts the latch members.

8 Claims, 5 Drawing Sheets

(56) References Cited

U.S. PATENT DOCUMENTS

| | | | | |
|---|---|---|---|---|
| 11,723,167 | B2 * | 8/2023 | Chen | G06F 1/181 361/679.02 |
| D1,095,432 | S * | 9/2025 | Du | D13/184 |
| 12,484,168 | B2 * | 11/2025 | Escamilla | H05K 5/0221 |
| 2003/0084542 | A1 * | 5/2003 | Wortman | G06F 1/181 16/382 |
| 2004/0233619 | A1 * | 11/2004 | Heistand, II | G06F 1/181 361/679.57 |
| 2010/0277866 | A1 * | 11/2010 | Chen | G06F 21/86 361/679.57 |
| 2011/0279973 | A1 * | 11/2011 | Terwilliger | H05K 7/1489 312/223.2 |
| 2014/0375196 | A1 * | 12/2014 | Nguyen | E05D 15/507 29/592 |
| 2015/0062796 | A1 * | 3/2015 | Yu | H05K 5/0221 49/460 |
| 2015/0086017 | A1 * | 3/2015 | Taylor | H04L 9/3242 380/270 |
| 2017/0257969 | A1 * | 9/2017 | Kuan | E05B 65/46 |
| 2018/0177071 | A1 * | 6/2018 | Liu | H05K 7/1489 |
| 2021/0097362 | A1 * | 4/2021 | Guzman | G06K 19/06159 |
| 2021/0382529 | A1 * | 12/2021 | Leatherdale | G10K 11/168 |
| 2022/0334621 | A1 * | 10/2022 | O'Donnell | G06F 11/3055 |
| 2023/0026830 | A1 * | 1/2023 | Donachy | G06F 3/147 |
| 2023/0129135 | A1 * | 4/2023 | Clark | H05K 5/0204 361/679.02 |
| 2024/0389250 | A1 * | 11/2024 | Zhao | H05K 7/18 |
| 2025/0142756 | A1 * | 5/2025 | O'Donnell | H05K 7/1495 |
| 2025/0142757 | A1 * | 5/2025 | O'Donnell | H05K 7/1495 |
| 2025/0212351 | A1 * | 6/2025 | Tseng | H05K 7/1402 |

* cited by examiner

ONE PIECE INFORMATION HANDLING SYSTEM BEZEL AND LATCH

BACKGROUND OF THE INVENTION

Field of the Invention

The present invention relates in general to the field of information handling system housings, and more particularly to a one piece information handling system bezel and latch.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems that provide server, storage and communication functions are often deployed in centralized data centers that have regulated power and thermal environments. For example, a typical data center has plural racks that each have plural slots to accept information handling systems. Each rack interfaces with power so that each of plural information handling systems has a regulated power supply to protect information handling system components. Each rack is also typically setup at an HVAC vent that blows treated air across the information handling system cooling airflow intakes. Cooling fans in the information handling systems typically regulate thermal conditions within the information handling system housing by varying the cooling airflow through the housing and exhausting heated air out an exhaust located at an opposite side of the intake. The HVAC intake accepts the heated air from information handling system exhausts, treats the air, and routes the treated air to the HVAC vent for intake to the information handling system intake. Thermal conditions are adjusted within the data center by the HVAC as thermal dissipation changes from the information handling systems due to variance in processing loads of the information handling systems.

Generally, in a data center the HVAC flow of treated air is used most efficiently by directing the flow from floor vents up the front side of the rack so that each information handling system in the rack can manage cooling air intake with internal cooling fans so that as much of the treated air as possible is directed through the information handling systems. Typically, each information handling system inserted in a rack slot has a front bezel through which the cooling airflow passes. The bezel typically includes a latch having a lock so that access to the information handling system is secured. When the lock is released, an end user activates the latch to release the bezel and access the information handling system. The bezels and related locks tend to have a robust construction to guard against unauthorized access. One example of a bezel and latch has metal construction with over 40 parts.

One difficulty that can arise with data center information handling system racks is that some of the rack slots are unpopulated. An open rack slot can impact cooling airflow support by the HVAC vent when air passes unimpeded to the HVAC intake. The reduced impedance across the empty space allows treated air to flow directly to the HVAC intake and reduces backpressure at a front side of the rack where information handling systems accept treated air. The reduced impedance and backpressure result in less of the treated air actually passing through the information handling system housing to cool the components. One technique to address this difficulty is to couple a plate to the rear side of a bezel to block air passage through empty rack slots when the bezel couples to the rack in the empty rack slot. Although effective, this approach is expensive when complex bezel latches couple over empty slots. In some instances, where an information handling system couples in a rack without a need to lock the system in place, the use of an expensive bezel and latch that includes a lock increases costs without adding value to the end user and with increasing the difficulty of recycling of the bezel after the rack slot is populated.

SUMMARY OF THE INVENTION

Therefore, a need has arisen for a system and method which covers an information handling system empty rack slot with a bezel to impede airflow.

In accordance with the present invention, a system and method are provided which substantially reduce the disadvantages and problems associated with previous methods and systems for coupling a bezel to an information handling system rack unpopulated slot. A one-piece information handling system bezel and latch integrates a release button and latch member in a contiguous piece of material that couples to a rack in a manner similar to a secure bezel without including an expensive and complex latching mechanism.

More specifically, an information handling system rack has plural slots that each accept an information handling system housing and support operations with power and thermal management. A security bezel couples to the rack over the information handling system to lock the system into the rack, the security bezel having a grill with openings to pass cooling airflow into the housing. When rack slots are unpopulated by an information handling system, a nonsecure bezel couples to the rack having a blank plate that fits over the opening of the rack slot to block cooling airflow through the opening. In one example embodiment, the nonsecure bezel is a single contiguous piece of injection molded plastic having latch members positioned in the same location as the secure bezel to snap into a coupling point of the rack. The latch members integrate with a spring member at an interior position and a release button at an exterior position. When the release button is pressed, the integrated pieces pivot at the spring member to retract the latch members and thereby release the nonsecure bezel.

The present invention provides a number of important technical advantages. One example of an important technical advantage is that a tool-less, one-piece solution having an integrated live-hinge latch provides consistent insertion and extraction at a rack slot adopted to couple at the same coupling points of a security bezel. Sustainable materials, such as recycled plastic, have an exterior that matches the security bezel appearance to provide an aesthetic appearance and a functionality once installed that matches the operation of the security bezel to release from the rack, such as by the press of buttons on opposing sides of the bezel. The one-piece design is inexpensive to manufacture, such as with injection molding, and readily recyclable without any breakdown or disassembly.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system rack slot opening is blocked to maintain airflow by a nonsecure bezel having a coupling configuration matching a secure bezel but fabricated from a single piece of contiguous material. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
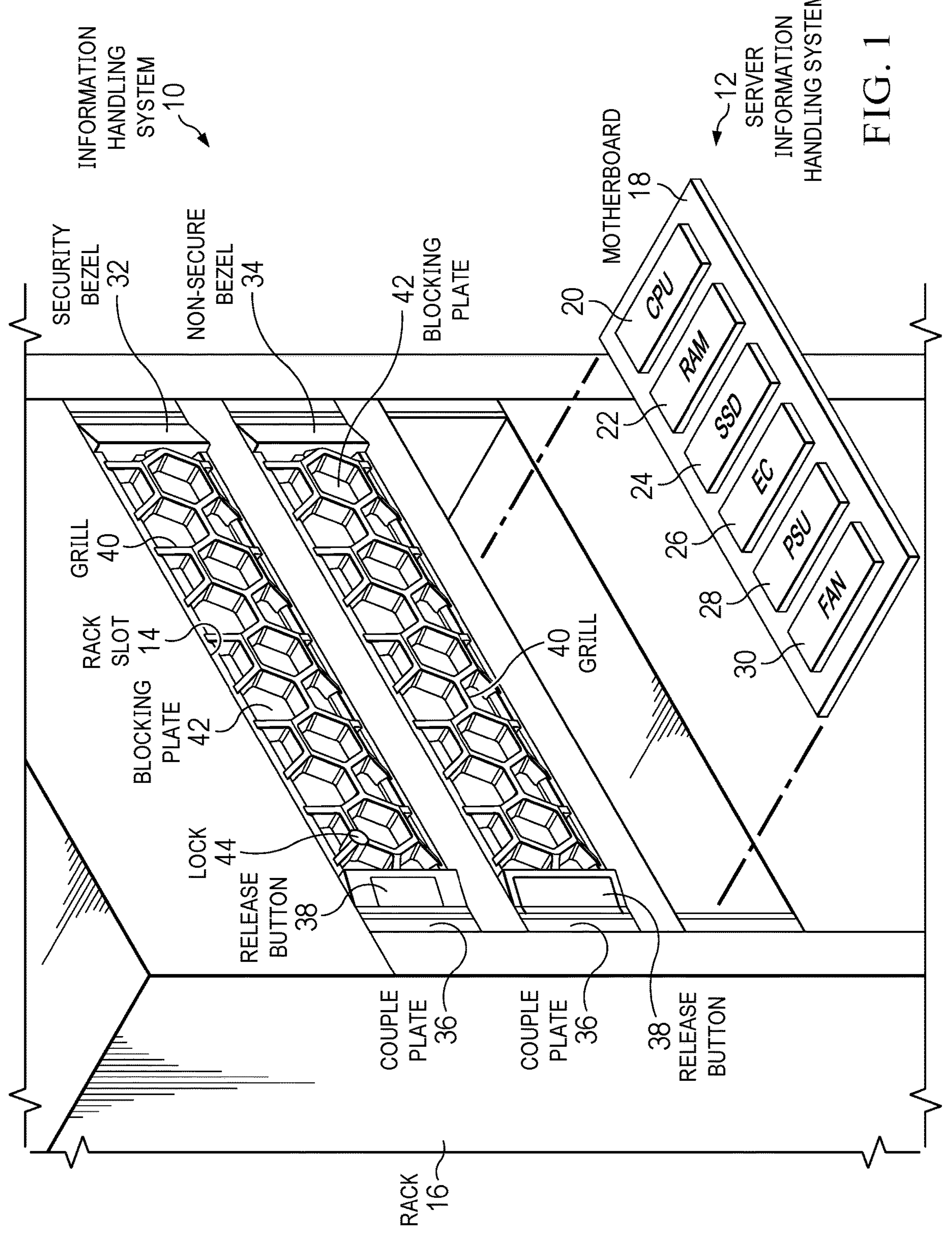
FIG. 1 depicts an information handling system rack having a secure bezel, a nonsecure bezel, an open rack slot and an information handling system without a bezel.

Referring now to FIG. 1, an information handling system 10 having a secure bezel 32, a nonsecure bezel 34, an open rack slot 14 and a server information handling system 12 without a bezel. Information handling system 10 is built into a rack 16 having plural rack slots 14 each sized to accept a server information handling system 12. Server information handling system 12 has a motherboard 18 that interfaces processing components that cooperate to process information. A central processing unit (CPU) 20 executes instructions that process information in cooperation with a random access memory (RAM) 22 that stores the information and instructions. A solid state drive (SSD) 24 provides persistent storage of instructions and information, such as an operating system and applications that execute on CPU 20. An embedded controller 26 manages physical operating constraints for the system, such as application of power by a power supply unit 28 and thermal management with a cooling fan 30. Once server information handling system 12 is coupled into rack slot 14, a security bezel 32 couples to rack 16 over server information handling system 12 to lock the system in place. Security bezel 32 can couple directly to rack 16 or indirectly by coupling to server information handling system to cover a release of the server information handling system to the rack. In the example embodiment, coupling plate 36, also referred to as a dogear, couples to latch members of both secure bezel 32 and nonsecure bezel 34 to hold the bezels in place.

The example embodiment depicts a server information handling system with basic processing capabilities. In various embodiments, various types of information handling systems may be supported with the example one-piece bezel, both for blocking an empty rack slot or to attach to an existing system that does not need a lock. In particular, a variety of storage solutions may be supported that may include physical enclosures that require bezels, such as storage bricks or storage appliances. The various types of storage devices may include an engine (or various types of platforms), with two compute based directors, packages software, cache and expandable storage drive array enclosures. Other types of storage devices may include Disk Processor Enclosures (DPE) that have storage drives, storage processors, link control boards, power supplies and fan modules. In some instances, rack solutions ship to end users with 50% of slots populated with server/storage products so that end user may add to the rack solution by add-on expansions to increase processing and/or storage capacity. In more expensive solutions, the expansion is achieved in a specific fashion due to cable lengths and the zones that will carry the expanded capabilities. When non-populated slots in a rack are between products, the filler bezels provide clues to the end user where the products are located and what functions empty slots will support. The nonsecure bezel offers visual cues to the end user without detracting from the overall system appearance. The look and feel of the nonsecure bezel mimics the secure bezel in appearance with similar functionality and feel when coupling in place and removing the nonsecure bezel. Yet, the nonsecure bezel has a robust single-piece design that survives shock, vibration and drop requirements, such as a 10 pound pull at the bezel without unlatching. The one-piece manufacture with a unique latch geometry is molded with sustainable resins that are reusable and recyclable.

In the example embodiment of FIG. 1, both secure bezel 32 and nonsecure bezel 34 couple over a blocking plate 42, such as a solid plastic piece that blocks airflow from passing through the rack slot 14 opening. Blocking plate 42 may integrate in contiguous material of the nonsecure bezel or may be inserted as a separate piece sized to block airflow. In alternative embodiments, both secure bezel 32 and nonsecure bezel 34 may couple over a server information handling system 12 without blocking plate 42 so that openings of a grill 40 allow air to pass through. A lock 44 in secure bezel 32 locks the bezel in place to prevent access to server information handling system 10, such as by preventing an inward press of release buttons 38 located on opposing ends of the bezel that actuate with an inward push to release the bezel latch members from coupling plate 36. In contrast, nonsecure bezel 34 lacks a lock 44 so that an inward press on release buttons 38 will release the bezel to expose the slot opening or information handling system underlying the bezel. An end user may select a nonsecure bezel to couple in place at a rack slot 14 when lock security is not necessary, such as with an empty rack slot or a less sensitive information handling system.

Figure 2A:
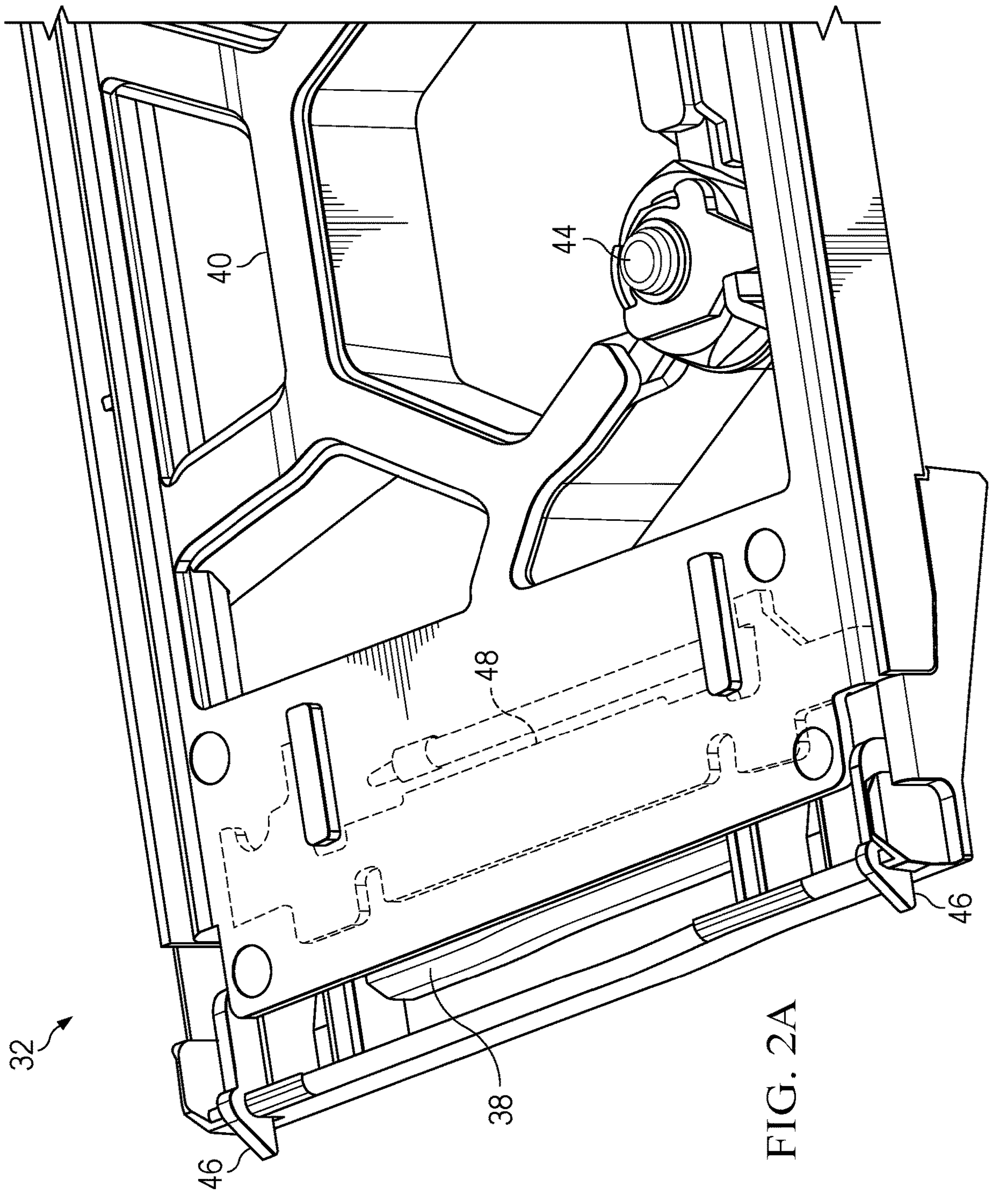
FIGS. 2A and 2B depict an interior view of a secure bezel and non-secure bezel.
Figure 2B:
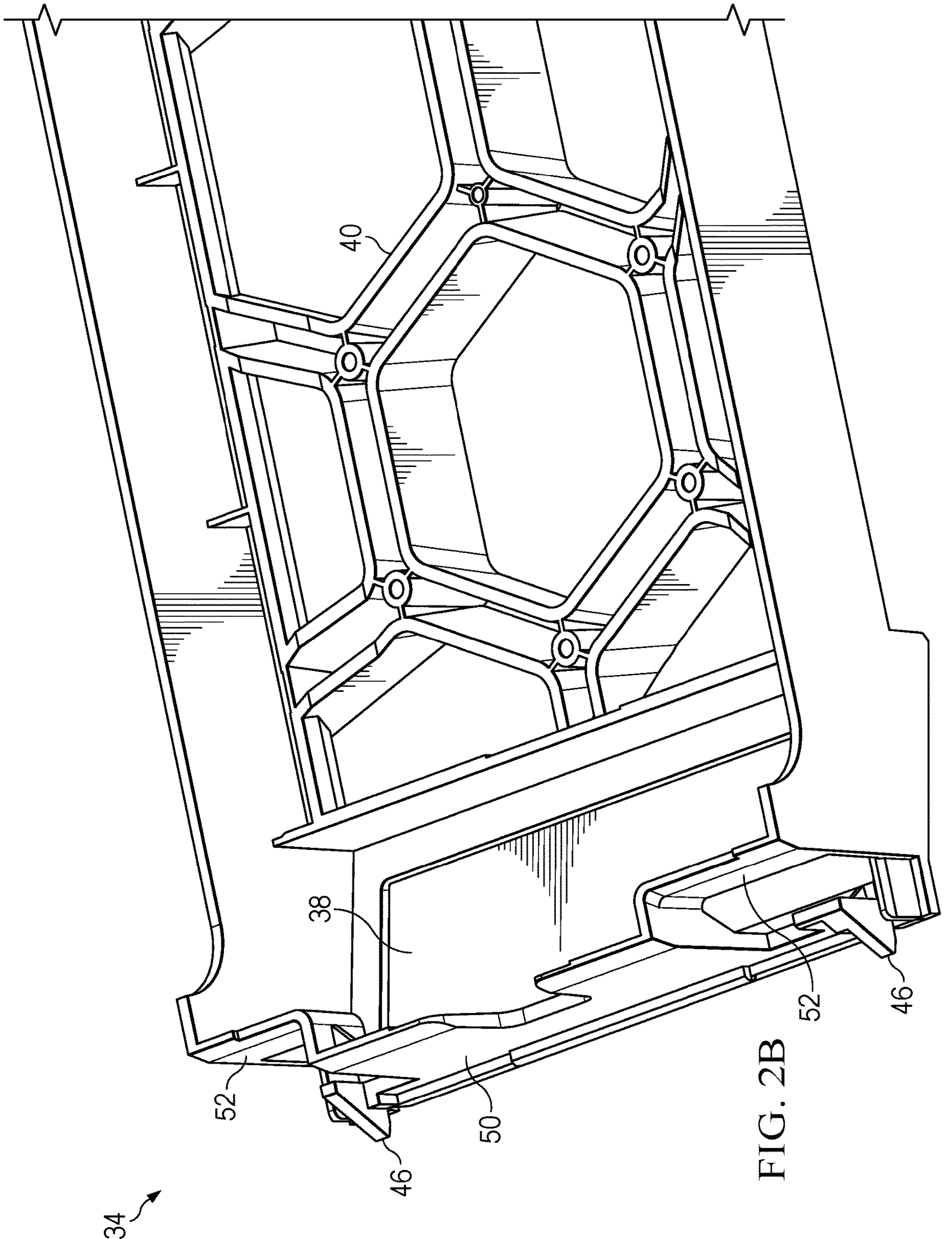

Referring now to FIGS. 2A and 2B, interior views of a secure bezel 32 and non-secure bezel 34 are depicted. FIG. 2A illustrates secure bezel 32 with a latch mechanism 48 that interacts with release button 38 and lock 44 to manage security of an information handling system. Latch members 46 extend out from latch mechanism 48 to engage coupling plates of the rack or information handling system. When latch mechanism 48 actuates in response to a press of release button 38, latch members 46 retract inward so that secure bezel 32 releases from the information handling system or rack. In one example, latch mechanism 48 has over 40 parts that assemble to interact in response to a release button press controlled by the position of lock 44. In contrast, FIG. 2B illustrates nonsecure bezel 34 that couples to the information handling system or rack to cover a rack opening. Both secure bezel 32 and nonsecure bezel 34 have a grill 40 with openings to accept airflow and can accept a blocking plate in the interior to prevent airflow. Nonsecure bezel 34 supports coupling with latch members 46 that match those of secure bezel 32, however, the latch members release in response to a press of release button 38 through a single piece of contiguous material, such as injection molded plastic from a recycled material. Release button 38 is molded to have an outline with a spacing from the rest of the material except at a spring member 50 having pivot points 52 about which release button 38 rotates when pressed. Pivot points 52 are located in an interior side of nonsecure bezel 34 so that latch members 46 extend out from a position between spring member 50 and release button 38. The location of pivot points 52 results in an inward movement of latch members 46 when release button 38 is pressed inward. Essentially, pivot points 52 define a living hinge at which the contiguous material flexes and can have a slightly less thick material to define the flexing location. Spring member 50 provides an outward bias to latch members 46 so that latch members 46 extend outward when release button 38 is released.

Injection molding of nonsecure bezel 34 from recycled plastic to form the release button and latch members as one contiguous piece with the bezel grill provides an inexpensive solution for bezel covering when security at the rack opening is not a consideration. The nonsecure bezel couples over an information handling system or an empty rack slot both with and without a blank plate that blocks air. When information handling system security is a consideration, a secure bezel may be used instead. When the nonsecure bezel is removed, the single piece construction and single material supports recycling of the entire bezel at one time. This reduces system costs and enhances an environmentally friendly approach to managing data center thermals and airflow.

Figure 3A:
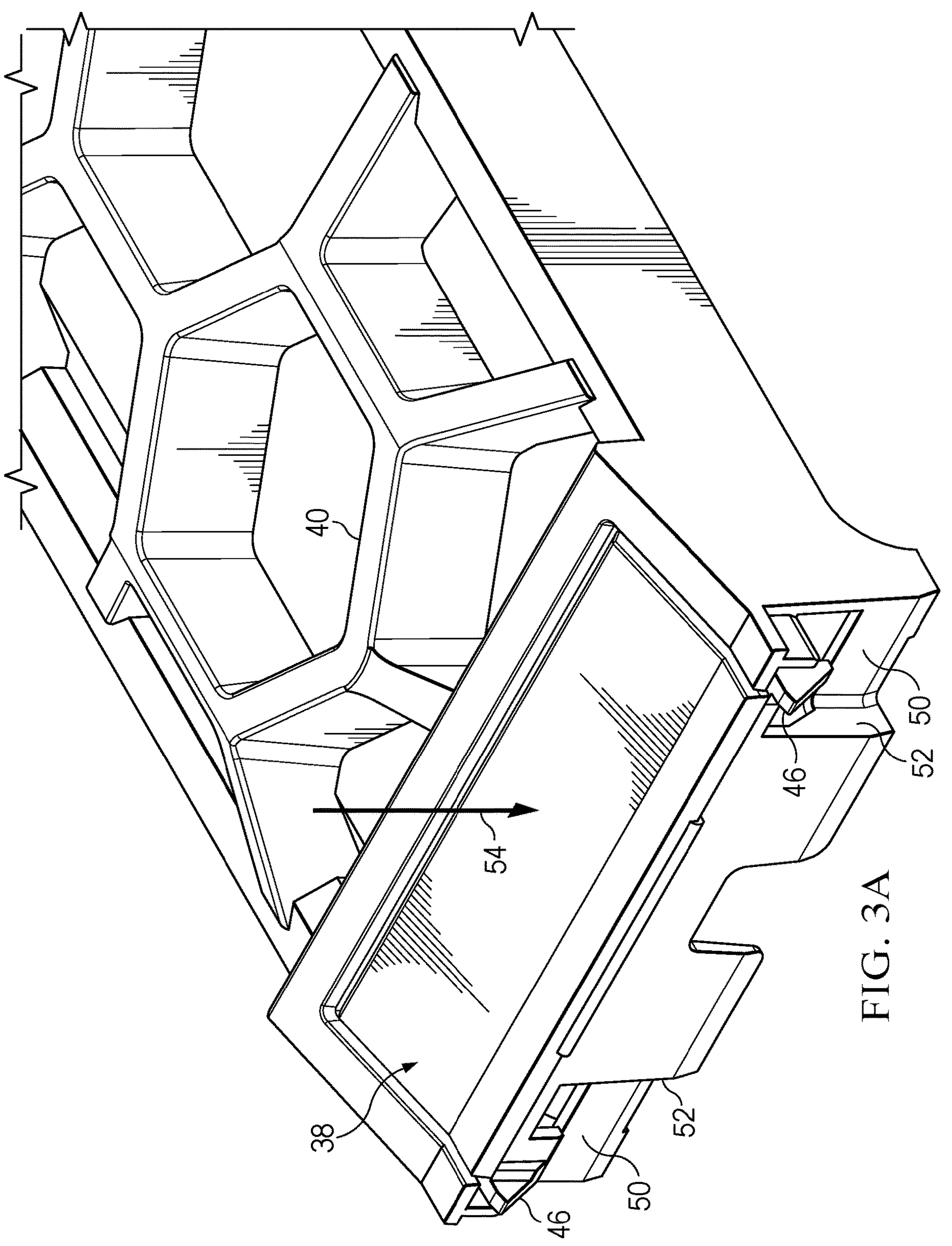
FIGS. 3A and 3B depict the nonsecure bezel in a latched and unlatched configuration.
Figure 3B:
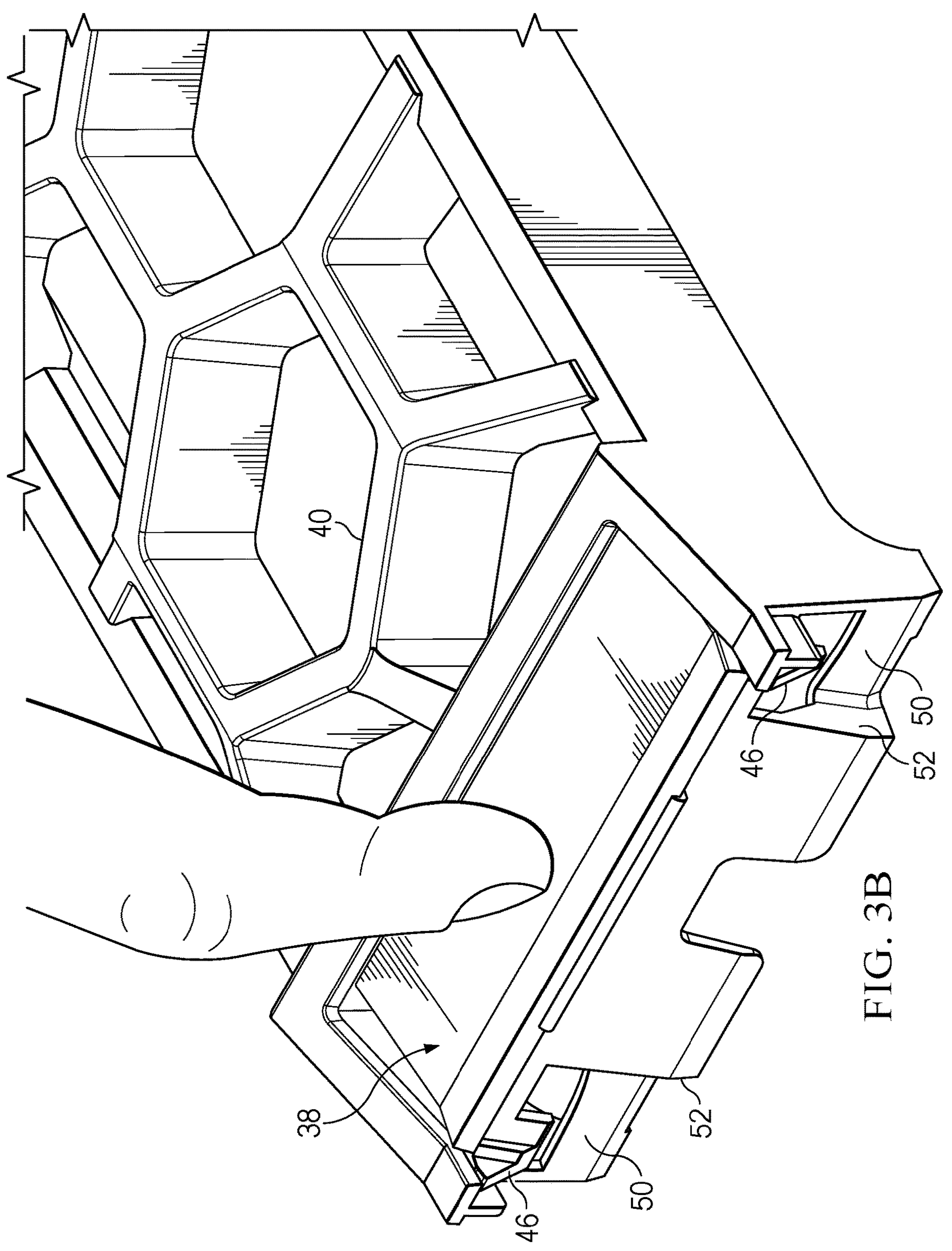

Referring now to FIGS. 3A and 3B depict the nonsecure bezel in a latched and unlatched configuration. FIG. 3A depicts release button 38 biased outward to extend latch members 46 outward about pivot 52 by operation of spring member 50. In this neutral position, the bezel couples to the rack by engagement of latch members 46 in a manner similar to that of a secure bezel. The rack slot that accepts the nonsecure bezel may vary in size from 1U, 2U, 3U or 4U standard sizes where latch members 46 are positioned to couple in the same location as a secure bezel of similar size. FIG. 3B depicts an inward press of release button 38 that retracts latch members 46 and biases the bezel out of the rack when the outer side of release button 38 presses outward and against the rack.

Although the present invention has been described in detail, it should be understood that various changes, substitutions and alterations can be made hereto without departing from the spirit and scope of the invention as defined by the appended claims.

What is claimed is:

1. An information handling system comprising:
- a rack having plural slots, each of the plural slots sized to accept an information handling system housing;
- an information handling system inserted into at least one of the plural slots;
- a first bezel coupled to the rack at the information handling system, the first bezel having latch members extending from opposing ends to couple to the rack, a release button on each of the opposing sides to release the latch members in response to a press inward at the release buttons, and a lock having an unlocked position that allows actuation of the release buttons and a locked position that prevents actuation of the release buttons, the release buttons separate from the latch members and interacting through plural assembled pieces; and
- a second bezel coupled to the rack at a one of the plural slots having an opening without an information handling system, the second bezel having the latch members extending from the opposing ends to couple to the rack and the release button on each of the opposing sides to release the latch members in response to a press inward at the release buttons, the second bezel coupling over the opening with a material contiguous with the release buttons and latch members;

wherein:
- the latch members of the second bezel and the release buttons of the second bezel are configured to interact through flexing at pivots of the contiguous material; and
- when the release buttons are pressed in, the flexing at the pivots of the contiguous material rotates the release buttons to retract the latch members inward.

2. The information handling system of claim 1 wherein the latch members of the second bezel are located between the release buttons of the second bezel and the pivots of the second bezel.

3. The information handling system of claim 2 wherein the second bezel integrates in the material spring members extending inward from the release buttons of the second bezel to support the pivots distal the release button of the second bezel.

4. The information handling system of claim 3 wherein the second bezel is formed with a contiguous piece of injection molded plastic.

5. The information handling system of claim 4 further comprising a blocking piece separately coupled to an inner surface of the second bezel to block airflow through openings of the second bezel and into the rack.

6. The information handling system of claim 3 further comprising:
- a second information handling coupled to the rack; and
- a third bezel coupled to the second information handling system, wherein the third bezel is identical to the second bezel.

7. The information handling system of claim 3 wherein the pivots are formed with injection molded plastic to rotate the release buttons of the second bezel at spacing around the release buttons of the second bezel down to the spring members.

8. The information handling system of claim 7 wherein the injection molded plastic comprises a majority of recycled plastic material.

* * * * *